United States Patent
Kim

(10) Patent No.: US 8,530,076 B2
(45) Date of Patent: Sep. 10, 2013

(54) PROTECTION CIRCUIT MODULE FOR RECHARGEABLE BATTERY AND RECHARGEABLE BATTERY PACK INCLUDING THE SAME

(75) Inventor: Woochull Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 837 days.

(21) Appl. No.: 12/267,773

(22) Filed: Nov. 10, 2008

(65) Prior Publication Data

US 2009/0123821 A1    May 14, 2009

(30) Foreign Application Priority Data

Nov. 12, 2007    (KR) ................ 2007-114926

(51) Int. Cl.
*H01M 2/02*    (2006.01)

(52) U.S. Cl.
USPC ........................ 429/170; 429/121; 429/122

(58) Field of Classification Search
USPC ........................................ 429/170, 122, 121
See application file for complete search history.

(56) References Cited

U.S. PATENT DOCUMENTS

| | | | |
|---|---|---|---|
| 6,154,371 A | 11/2000 | Oba et al. | |
| 2003/0077486 A1* | 4/2003 | Iwaizono et al. | 429/7 |
| 2005/0214597 A1 | 9/2005 | Kim et al. | |
| 2007/0026296 A1 | 2/2007 | Byun et al. | |

FOREIGN PATENT DOCUMENTS

| | | |
|---|---|---|
| CN | 1922745 A | 2/2007 |
| JP | 2537160 | 5/1997 |
| JP | 2001-250532 | 9/2001 |
| JP | 2005-183157 | 7/2005 |
| JP | 2008-192413 | 8/2008 |
| KR | 10-2006-0034180 | 4/2006 |
| KR | 10-0749655 | 8/2007 |

OTHER PUBLICATIONS

SIPO Office action dated Dec. 2, 2010, for corresponding Chinese Patent application 200810172713.0, with English translation.
Patent Abstracts of Japan and English machine translation of Japanese Publication No. 60-081958 corresponding to Japanese Patent 2537160 listed above, 4 pages.
Patent Abstracts of Japan and English machine translation of Japanese Publication No. 2005-183157 listed above,10 pages.
English-language Abstract of 10-2007-0065560.
Extended European Search Report dated Apr. 4, 2011 issued by the EPO for European Patent No. 08168953.1, 6 pages.

* cited by examiner

*Primary Examiner* — Jane Rhee
(74) *Attorney, Agent, or Firm* — Christie, Parker & Hale, LLP

(57) ABSTRACT

A protection circuit module and a rechargeable battery pack including the PCM. The battery pack includes: an electrode assembly, which has a positive electrode plate, a separator, and a negative electrode plate; a case to house the electrode assembly and an electrolyte; and the protection circuit module. The protection circuit module includes: a protection circuit board having an inner surface that faces the electrode assembly and an opposing outer surface; and a protection circuit part mounted in a hole formed in the inner surface of the protection circuit board, such that the protection circuit board is flush with the inner surface of the protection circuit board.

18 Claims, 4 Drawing Sheets

30

US 8,530,076 B2

PROTECTION CIRCUIT MODULE FOR RECHARGEABLE BATTERY AND RECHARGEABLE BATTERY PACK INCLUDING THE SAME

CROSS-REFERENCE TO RELATED APPLICATION

This application claims the benefit of Korean Patent Application No. 2007-114926, filed Nov. 12, 2007, in the Korean Intellectual Property Office, the disclosure of which is incorporated herein, by reference.

BACKGROUND OF THE INVENTION

1. Field of the Invention

Aspects of the present invention relate to a protection circuit module and a rechargeable battery pack including the same.

2. Description of the Related Art

In general, rechargeable batteries have been widely developed for use in portable devices. The most popular rechargeable batteries include Ni-MH batteries, lithium batteries, and lithium ion batteries.

Rechargeable batteries generally include an electrode assembly and a case to house the electrode assembly. An electrode assembly includes a positive electrode, a negative electrode, and a separator. A case can be a can or pouch, which is formed of aluminum or an aluminum alloy, and is used to electrically couple an electrode assembly to an external terminal, after sealing an opening of the case. A liquid or solid electrolyte is injected into the case. If a case is formed of aluminum or an aluminum alloy, the battery becomes lightweight and does not corrode when used at a high voltage, for a long period of time.

Currently, many portable electronic devices are becoming smaller. This has increased the demand for rechargeable batteries, or rechargeable battery packs, that are small, light weight, and have a high capacity. One way to reduce the size of a rechargeable battery pack, is to minimize the space occupied by external devices or parts, such as a cap assembly and a protection circuit module (PCM).

SUMMARY OF THE INVENTION

Aspects of the present invention provide a protection circuit module for a rechargeable battery. The protection circuit module includes: a protection circuit board, having an inner surface and an opposing outer surface; and a protection circuit part mounted in a hole formed in the inner surface of the protection circuit board, such that the protection circuit part is flush with the inner surface.

According to aspects of the present invention, the hole may be a depression formed in the inner surface of the protection circuit board, or the hole may be a through-hole that extends between the inner and outer surfaces of the protection circuit board.

According to aspects of the present invention, the protection circuit part is inserted upside down in the hole, and a lead frame of the protection circuit part is soldered to a circuit pattern formed on the inner surface of the protection circuit board.

According to aspects of the present invention, provided is a rechargeable battery pack including: an electrode assembly, which includes a negative electrode plate, a separator, and a positive electrode plate; a case to house the electrode assembly and an electrolyte; a protection circuit module disposed on the case. The protection circuit module includes: a protection circuit board, having an inner surface that faces the electrode assembly and an opposing outer surface; and a protection circuit part seated in a hole formed in the inner surface of the protection circuit board, such that the protection circuit part is flush with the inner surface of the protection circuit board.

According to aspects of the present invention, the hole may be a depression formed in the inner surface of the protection circuit board.

According to aspects of the present invention, the hole may be a through-hole that extends between the inner and outer surfaces of the protection circuit board.

According to aspects of the present invention, the protection circuit module further includes: a circuit pattern disposed on the inner surface of the protection circuit board; and a lead frame to connect the protection circuit part to the circuit pattern.

According to aspects of the present invention, the protection circuit part is inserted upside down in the hole, and the lead frame may be soldered to the circuit pattern.

According to aspects of the present invention, the battery pack further includes a cap assembly to seal an opening of the can, and a hot melt resin to attach the protection circuit module to the cap assembly.

According to aspects of the present invention, the case can be a pouch-type case or a can-type case.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1:
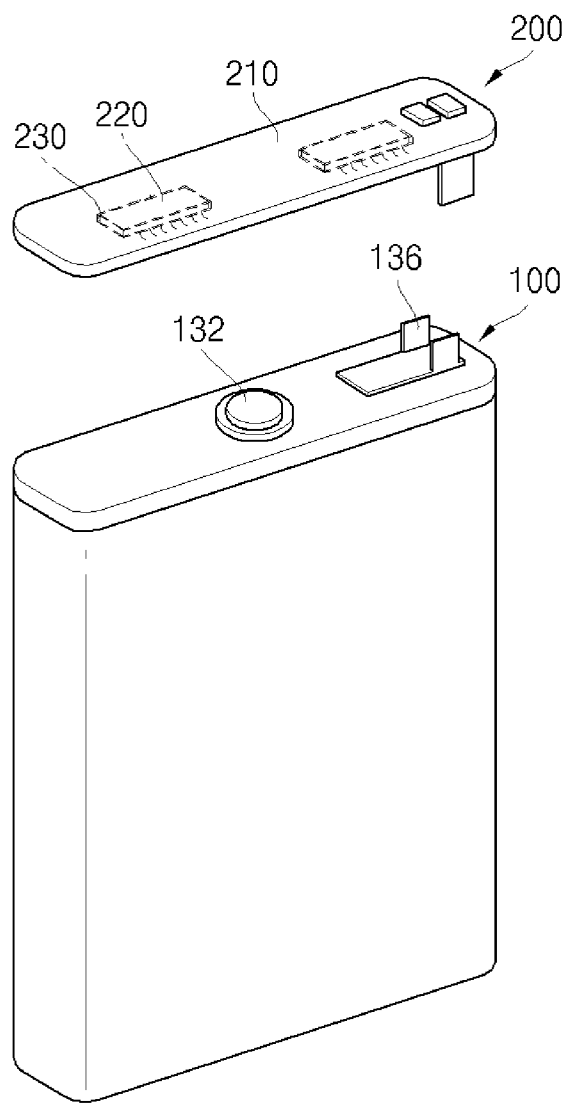
FIG. 1 is an exploded perspective view of a rechargeable battery pack, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

FIG. 1 illustrates a can-type rechargeable battery pack 10, according to an exemplary embodiment of the present invention. The battery pack 10 includes a bare cell (rechargeable battery) 100 and a protection circuit module 200 that is electrically coupled to the bare cell 100. A molding resin (not shown) can be used to attach the bare cell 100 to the protection circuit module 200, or the attachment can be made using an additional casing assembly.

Figure 2:
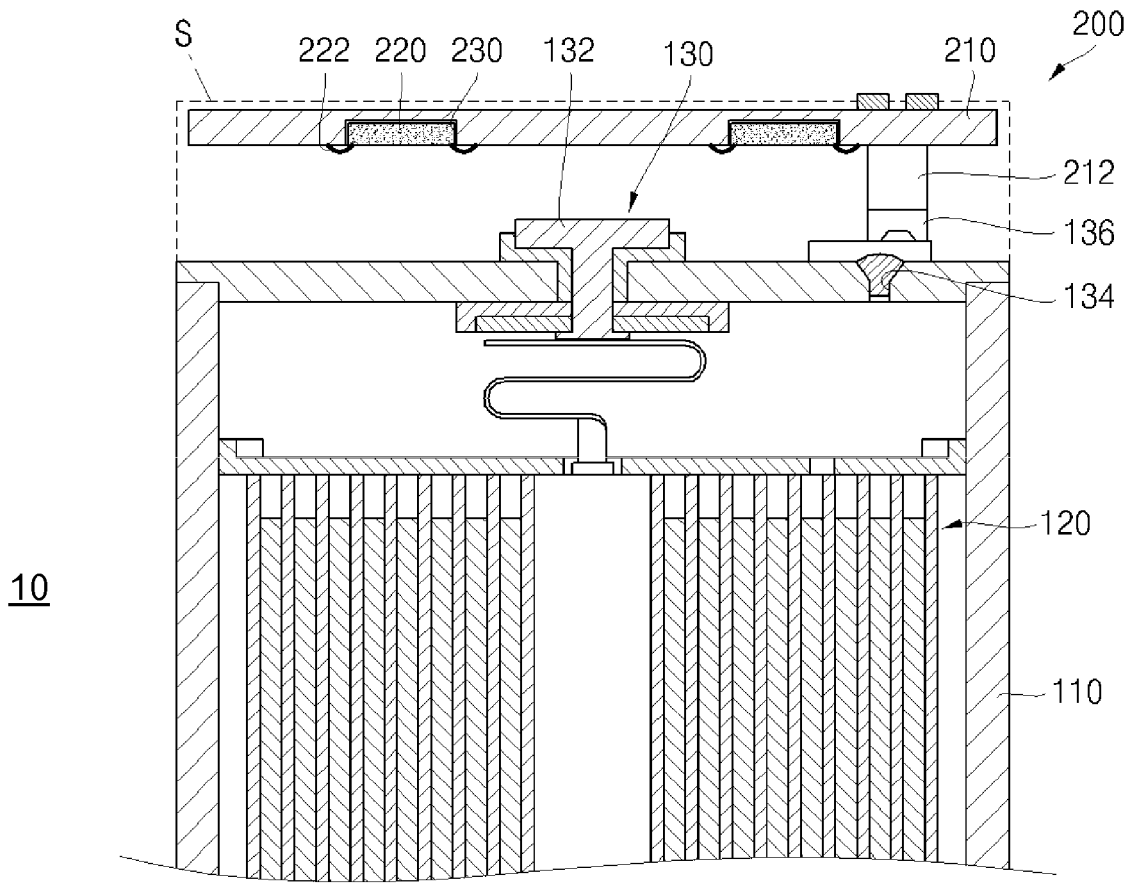
FIG. 2 is a partial cross-sectional view of the battery pack of FIG. 1.
Figure 3:
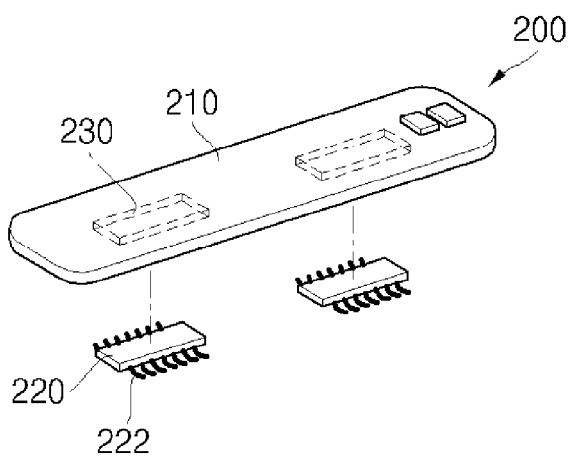
FIG. 3 is an exploded perspective view of a protection circuit module of FIG. 2.

As illustrated in FIGS. 2 and 3, the bare cell 100 includes an electrode assembly 120, a rectangular can 110 to house the electrode assembly 120, and a cap assembly 130 to seal an opening of the can 110. The electrode assembly 120 includes a positive electrode plate, a negative electrode plate, and a separator disposed therebetween. A liquid electrolyte is injected into the can 110, through an electrolyte injection hole 134 of the cap assembly 130. An electrode terminal 132, which is connected to the positive electrode plate or the negative electrode plate, protrudes outside the can 110, through the cap assembly 130. The electrode assembly 120 is also connected to the can 110, such that the can 110 has the opposite polarity of the electrode terminal 132 and is an electrode terminal.

To build the battery pack 10, the bare cell 100 is connected to safety devices, such as a positive temperature coefficient (PTC) element, a thermal fuse, or a protection circuit module. Generally the bare cell 100 and the safety devices are joined by a resin mold S. The PCT element and the thermal fuse are not shown in drawings of the present invention.

The protection circuit module 200 is attached to, and electrically coupled with, the bare cell 100 and is electrically coupled to the electrode terminals. The protection circuit module 200 includes a protection circuit board 210 and a plurality of protection circuit parts 220 mounted on one surface of the protection circuit board 210. The protection circuit board 210 includes a lead plate 212 that is electrically coupled to a lead plate 136 of the cap assembly 130.

Here, a plurality of protection circuit parts 220 are mounted on an inner surface of the protection circuit board 210, that is, the surface facing the cap assembly 130. Mounting the protection circuit part 220 on an opposing outer surface of the protection circuit board 210 increases the thickness of the protection circuit module 200. While the protection circuit parts 220 are shown as semiconductor chips, the protection circuit parts 220 may be various other electrical resistance elements, or other elements may be additionally installed on the protection circuit board 210.

A hole 230 is formed in the inner surface of the protection circuit board 210. The hole 230 provides a space for mounting the protection circuit part 220. The width and depth of the hole 230 can be set such that the protection circuit part 220 can be mounted flush with the inner surface of the protection circuit board 210. However, the present invention is not limited to any particular dimensions. In addition, while two holes 230 and protection circuit parts 220 are shown, the present invention is not limited to any particular number thereof.

A lead frame 222, protrudes from sides of the protection circuit part 220. The lead frame connects the protection circuit part 220 to a circuit pattern (not shown) formed on the inner surface of the protection circuit board 210. Since the protection circuit part 220 is mounted so as to be flush with the a protection circuit board 210, the lead frame 222 may be soldered to the circuit pattern. The protection circuit part 220 can be mounted in the hole 230 in an inverted orientation, such that the lead frame 222 extends from an inner surface of the protection circuit part, which faces away from the protection circuit board 210. This differs from the related art, where a protection circuit part is generally mounted such that a lead frame extends from a surface of a protection circuit part, which contacts a protection circuit board.

However, the orientation of the protection circuit part 220, with respect to the protection circuit board 210, is not critical to the aspects of the present invention, so long as the protection circuit part 220 is mounted in the hole 230 and is flush with a surface of the protection circuit board 220. In addition, the protection circuit part 220 is generally mounted on an inner surface of the protection circuit board 220. Because the protection circuit part 220 is inserted into the hole 230, the overall thickness of the protection circuit module 200 is reduced, as compared to when a protection circuit part 220 is not mounted in an hole.

A gap between the bare cell 100 and the protection circuit board 210 may be reduced, because the protection circuit part 220 is mounted in the hole 230. This reduction leads to a reduction in the length of the battery pack 10. For example, when a protection circuit board is 0.8 mm thick, and a protection circuit part is 0.6 mm thick, the depth of the hole 230 is generally at least 0.6 mm.

Figure 4:
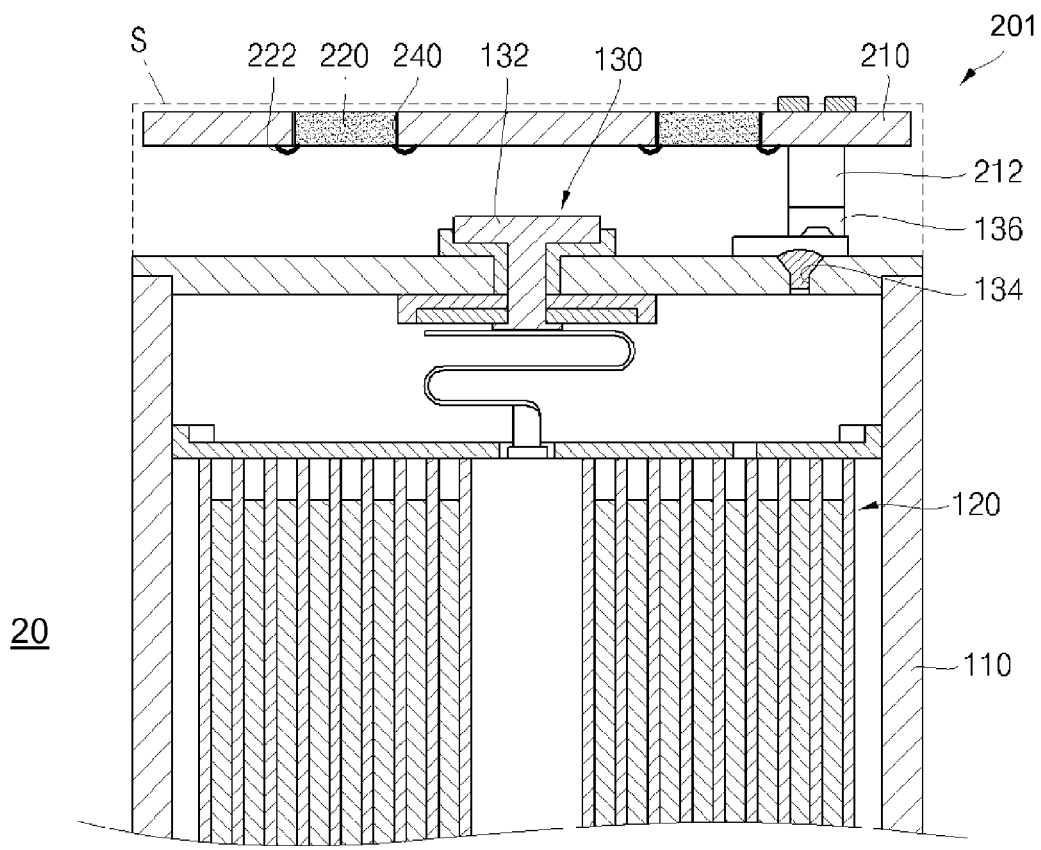
FIG. 4 is a partial cross-sectional view of a rechargeable battery back, according to another exemplary embodiment of the present invention.
Figure 5:
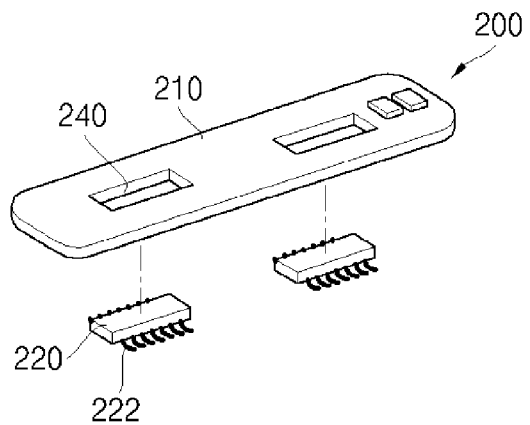
FIG. 5 is an exploded perspective view of a protection circuit module of FIG. 4.

FIGS. 4 and 5 illustrate a rechargeable battery pack 20, according to another exemplary embodiment of the present invention. The battery pack 20 includes a bare cell 100 (rechargeable battery) and a protection circuit module 201. The protection circuit module 201 is similar to the protection circuit module 200, except the protection circuit board 210 has a hole 240 that is different from the hole 230. Therefore, similar elements will not be described in detail.

The hole 240 is a through-hole that extends between the inner and outer surfaces of the protection circuit board 210. The size of the hole 240 is set according to the size of a protection circuit part 220. A lead frame 222 is connected to a circuit pattern (not shown) of the protection circuit board 210, after the protection circuit part 220 is inserted into the hole 240. In this exemplary embodiment, the protection circuit part 220 is inserted into the hole 240, such that the protection circuit part 220 is flush with the inner and outer surfaces of the protection circuit board 210. In general, a through-hole is used when a protection circuit part has about the same thickness, for example 0.8 mm, as the protection circuit board 210.

Figure 6:
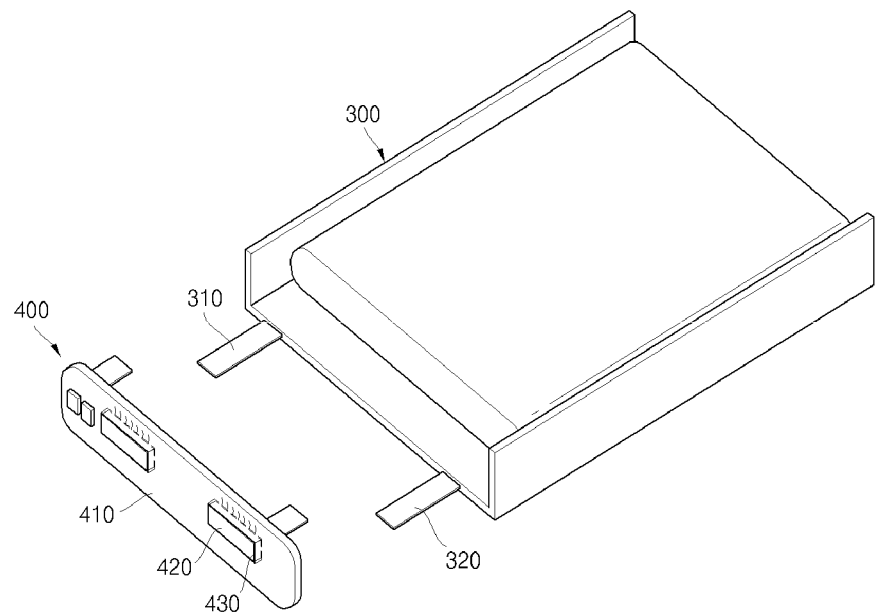
FIG. 6 is an exploded perspective view of a rechargeable battery pack, according to an exemplary embodiment of the present invention.

FIG. 6 illustrates a pouch-type rechargeable battery pack 30. The battery pack 30 includes a protection circuit module 400 and a pouch-type battery 300. The protection circuit module 400 is electrically coupled to electrode tabs 310, 320, which extend out of the battery 300. A protection circuit part 420 is inserted into a hole 430 formed in an inner surface of a protection circuit board 410 of the protection circuit module 400. In the alternative, the protection circuit part 420 can be installed in a through-hole (not shown) formed in the protection circuit board 410.

Because the protection circuit part 420 is inserted inside the protection circuit board 410, the protection circuit part 420 does not increase the thickness of the protection circuit module 400. Therefore, the protection circuit module 400 may be positioned closer to the battery 300, such that the length of the battery pack 30 can be reduced. In addition, the protection circuit part is better protected from external forces, that if it were mounted on an outer surface of the protection circuit board 410.

As explained above, a rechargeable battery pack, according to aspects of the present invention, has a reduced size, and can be applied to a variety of small-sized electronic devices.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A protection circuit module for a rechargeable battery, comprising:
   a protection circuit board having an inner surface that faces the rechargeable battery and an opposing outer surface;
   a protection circuit part mounted in a hole formed in the inner surface of the protection circuit board; and
   a circuit pattern disposed on the protection circuit board, the circuit pattern being coupled to the protection circuit part,
   wherein the protection circuit part is mounted so as to be flush with the inner surface of the protection circuit board.

2. The protection circuit module of claim 1, wherein the hole does not extend to the outer surface of the protection circuit board.

3. The protection circuit module of claim 1, wherein the hole is a through-hole that extends between the inner and outer surfaces of the protection circuit board.

4. The protection circuit module of claim 1, further comprising:
   a lead frame to connect the protection circuit part to the circuit pattern, wherein
   the protection circuit part is inserted into the hole upside down, and
   the circuit pattern is disposed on the inner surface of the protection circuit board.

5. A rechargeable battery pack comprising:
   an electrode assembly comprising a positive electrode plate, a separator, and a negative electrode plate;
   a case to house the electrode assembly and an electrolyte; and
   a protection circuit module electrically connected to the electrode assembly, comprising,
      a protection circuit board having an inner surface that faces the electrode assembly and an opposing outer surface,
      a protection circuit part mounted in a hole formed in the inner surface of the protection circuit board, such that the protection circuit part is flush with the inner surface of the protection circuit board; and
      a circuit pattern disposed on the protection circuit board, the circuit pattern being coupled to the protection circuit part,
   wherein the protection circuit part is mounted so as to be flush with the inner surface of the protection circuit board.

6. The rechargeable battery of claim 5, wherein the hole does not extend to the outer surface of the protection circuit board.

7. The rechargeable battery of claim 5, wherein the hole is a through-hole that extends between the inner and outer surfaces of the protection circuit board.

8. The rechargeable battery of claim 5, wherein the protection circuit module further comprises:
   a lead frame to connect the protection circuit part to the circuit pattern, wherein
   the circuit pattern is disposed on the inner surface of the protection circuit board.

9. The rechargeable battery of claim 8, wherein the protection circuit part is inserted into the hole upside down.

10. The rechargeable battery of claim 8, wherein the lead frame of the protection circuit part is soldered to the circuit pattern.

11. The rechargeable battery of claim 5, wherein the case is a can-type case.

12. The rechargeable battery of claim 5, further comprising:
    a cap assembly to seal an opening of the case; and
    a hot-melt resin to attach the cap assembly to the protection circuit module.

13. The rechargeable battery of claim 5, wherein the case is a pouch-type case.

14. The rechargeable battery of claim 5, wherein the protection circuit board comprises a plurality of the holes and a plurality of the protection circuit parts, which are disposed in respective ones of the holes.

15. The rechargeable battery of claim 14, wherein:
    at least one of the holes is a through-hole that extends between the inner and outer surfaces; and
    at least one of the holes does not extend to the outer surface.

16. The protection circuit module of claim 1, wherein the protection circuit board comprises a plurality of the holes and a plurality of the protection circuit parts, which are disposed in respective ones of the holes.

17. The protection circuit module of claim 16, wherein:
    at least one of the holes is a through-hole that extends between the inner and outer surfaces; and
    at least one of the holes does not extend to the outer surface.

18. A protection circuit module for a rechargeable battery, comprising:
    a protection circuit board having an inner surface that faces the rechargeable battery and an opposing outer surface;
    a semiconductor chip mounted in a hole formed in the inner surface of the protection circuit board; and
    a circuit pattern disposed on the protection circuit board, the circuit pattern being coupled to the semiconductor chip,
    wherein the semiconductor chip is mounted so as to be flush with the inner surface of the protection circuit board.

* * * * *